(12) United States Patent
Sylvestre et al.

(10) Patent No.: US 10,390,460 B2
(45) Date of Patent: Aug. 20, 2019

(54) APPARATUS AND METHODS FOR COOLING OF AN INTEGRATED CIRCUIT

(71) Applicant: SYSTEMEX-ENERGIES INTERNATIONAL INC., St. Michael (BB)

(72) Inventors: Julien Sylvestre, Sherbrooke (CA); Simon Jasmin, Montreal (CA)

(73) Assignee: SYSTEMEX-ENERGIES INTERNATIONAL INC., St. Michael (BB)

( * ) Notice: Subject to any disclaimer, the term of this patent is extended or adjusted under 35 U.S.C. 154(b) by 0 days.

(21) Appl. No.: 15/418,339

(22) Filed: Jan. 27, 2017

(65) Prior Publication Data

US 2017/0223871 A1 Aug. 3, 2017

Related U.S. Application Data

(60) Provisional application No. 62/288,672, filed on Jan. 29, 2016.

(51) Int. Cl.
*H03L 1/04* (2006.01)
*H05K 7/20* (2006.01)
(Continued)

(52) U.S. Cl.
CPC ......... *H05K 7/20281* (2013.01); *H01L 23/34* (2013.01); *H01L 23/427* (2013.01); *H03L 1/04* (2013.01); *H05K 7/20445* (2013.01)

(58) Field of Classification Search
CPC ...... G06F 1/181–182; G06F 1/20–206; H05K 7/20218–20381; H05K 7/20409–20418; H05K 7/20009–202; H05K 7/20281; H05K 7/20445; H05K 1/0201; H05K 1/0272; H01L 23/367–3677; H01L 23/473; H01L 23/46–467; H01L 23/34–4735; H03L 1/04
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 6,064,572 A * 5/2000 Remsburg ........... H01L 23/4336
165/80.4
6,349,554 B2 * 2/2002 Patel ...................... F25B 39/04
165/104.33

(Continued)

*Primary Examiner* — Anthony M Haughton
*Assistant Examiner* — Razmeen Gafur

(57) ABSTRACT

Systems and methods for cooling an Integrated Circuit (IC) are provided. In one embodiment, the system includes a vessel for holding a coolant in a liquid phase, where the IC is at least in part thermally coupled to the coolant to transfer heat generated by the IC to the coolant. The system also includes a controller for periodically increasing a heat flux supplied by the IC to the coolant followed by a reduction of the heat flux supplied by the IC to the coolant. Methods for controlling the operational parameters of the IC to periodically increasing and then decreasing the heat flux supplied by the IC to the coolant are also provided. A sensor may be used to sense a state of phase change of the coolant and which generates a signal that the controller uses to adjust the heat flux supplied by the IC.

13 Claims, 14 Drawing Sheets

(51) Int. Cl.
  *H01L 23/34* (2006.01)
  *H01L 23/427* (2006.01)

(56) References Cited

U.S. PATENT DOCUMENTS

| | | | | |
|---|---|---|---|---|
| 6,595,014 B2* | 7/2003 | Malone | F28D 15/06 | 165/104.33 |
| 6,612,120 B2* | 9/2003 | Patel | G06F 1/20 | 165/104.33 |
| 7,061,104 B2* | 6/2006 | Kenny, Jr. | G06F 1/26 | 257/714 |
| 7,100,381 B2* | 9/2006 | Hale | F28F 3/12 | 62/121 |
| 7,134,289 B2* | 11/2006 | Patel | F25B 23/006 | 62/121 |
| 7,261,144 B2* | 8/2007 | Thome | F28D 15/0266 | 165/104.21 |
| 7,477,513 B1* | 1/2009 | Cader | H01L 23/4735 | 165/80.4 |
| 7,545,644 B2* | 6/2009 | Fedorov | H01L 23/427 | 165/104.21 |
| 7,549,298 B2* | 6/2009 | Bash | F28D 5/00 | 62/121 |
| 7,836,706 B2* | 11/2010 | Tilton | F28D 5/00 | 165/104.33 |
| 7,882,890 B2* | 2/2011 | Manzer | H01L 23/427 | 165/104.24 |
| 8,061,414 B2* | 11/2011 | Suzuki | F24F 5/0035 | 165/104.33 |
| 8,087,256 B2* | 1/2012 | Babkin | C09K 5/041 | 62/114 |
| 8,983,676 B2* | 3/2015 | Sharma | H01L 23/34 | 700/300 |
| 9,500,414 B2* | 11/2016 | Tonkovich | B01B 1/005 | |
| 9,543,787 B2* | 1/2017 | Duchesneau | F01K 13/006 | |
| 9,696,073 B2* | 7/2017 | Noboa | F25B 49/005 | |
| 10,220,955 B2* | 3/2019 | Gregory | B64D 45/00 | |
| 2002/0163782 A1* | 11/2002 | Cole | H01L 23/473 | 361/699 |
| 2005/0185378 A1* | 8/2005 | Tilton | H05K 7/20345 | 361/699 |
| 2006/0137860 A1* | 6/2006 | Prasher | F28D 15/0266 | 165/104.33 |
| 2006/0162363 A1* | 7/2006 | Sharma | H01L 23/4735 | 62/259.2 |
| 2007/0023169 A1* | 2/2007 | Mahalingam | F25D 17/02 | 165/104.28 |
| 2007/0230126 A1* | 10/2007 | Pautsch | H01L 23/4735 | 361/699 |
| 2008/0043440 A1* | 2/2008 | Fedorov | H01L 23/427 | 361/700 |
| 2008/0073061 A1* | 3/2008 | Dias | H01L 23/427 | 165/80.4 |
| 2008/0093058 A1* | 4/2008 | Kim | F28F 3/12 | 165/133 |
| 2008/0104970 A1* | 5/2008 | Suzuki | F24F 5/0035 | 62/64 |
| 2008/0173427 A1* | 7/2008 | Schumacher | H05K 7/20609 | 165/104.14 |
| 2008/0236795 A1* | 10/2008 | You | H01L 23/427 | 165/104.21 |
| 2008/0237845 A1* | 10/2008 | Kim | G06F 1/203 | 257/715 |
| 2009/0260783 A1* | 10/2009 | Suzuki | F28D 15/02 | 165/104.29 |
| 2010/0142150 A1* | 6/2010 | Campbell | H01L 23/473 | 361/702 |
| 2010/0206527 A1* | 8/2010 | Hu | C09D 7/70 | 165/133 |
| 2010/0263838 A1* | 10/2010 | Mahalingam | F25D 17/02 | 165/104.31 |
| 2010/0290188 A1* | 11/2010 | Brunschwiler | H01L 23/473 | 361/699 |
| 2010/0328891 A1* | 12/2010 | Campbell | F28D 15/0266 | 361/700 |
| 2011/0308231 A1* | 12/2011 | Carpenter | F02K 9/72 | 60/204 |
| 2012/0087088 A1* | 4/2012 | Killion | F28D 15/0266 | 361/697 |
| 2013/0020059 A1* | 1/2013 | Park | B01D 1/065 | 165/133 |
| 2014/0146467 A1* | 5/2014 | Campbell | H05K 7/20236 | 361/679.53 |
| 2014/0214365 A1* | 7/2014 | Ligeret | G01M 99/005 | 702/183 |
| 2014/0247557 A1* | 9/2014 | Qiu | H01L 23/46 | 361/700 |
| 2014/0311725 A1* | 10/2014 | Balasubramanian | F28F 3/04 | 165/168 |
| 2015/0075000 A1* | 3/2015 | Cox | H01L 23/367 | 29/890.03 |
| 2015/0109735 A1* | 4/2015 | Campbell | H05K 7/20318 | 361/700 |
| 2015/0359133 A1* | 12/2015 | Joshi | H05K 7/2029 | 361/700 |
| 2016/0128231 A1* | 5/2016 | Wagoner | H05K 7/203 | 165/104.31 |
| 2016/0143184 A1* | 5/2016 | Campbell | H05K 7/20254 | 361/699 |
| 2016/0242319 A1* | 8/2016 | Edwards | H05K 7/20781 | |
| 2017/0105313 A1* | 4/2017 | Shedd | H05K 7/20272 | |
| 2017/0138223 A1* | 5/2017 | Kontomaris | F01K 25/10 | |
| 2017/0138678 A1* | 5/2017 | Jaikumar | F28F 13/187 | |
| 2017/0176114 A1* | 6/2017 | Kandlikar | F28F 13/187 | |
| 2017/0179001 A1* | 6/2017 | Brunschwiler | H01L 23/427 | |
| 2017/0191765 A1* | 7/2017 | Lee et al. | F28F 13/02 | |
| 2018/0064002 A1* | 3/2018 | France | H01L 23/427 | |

* cited by examiner

US 10,390,460 B2

APPARATUS AND METHODS FOR COOLING OF AN INTEGRATED CIRCUIT

FIELD OF THE INVENTION

The invention generally relates to cooling of integrated circuits and more particularly to apparatus and methods for cooling of an integrated circuit by use of a liquid coolant.

BACKGROUND

The amount of power an integrated circuit (IC) produces fluctuates based on computational workload of the IC. In general, an increase in power results in an increase in temperature of the IC and in particular an increase in the transistors junction temperature. As the junction temperature increases so does the probability of getting logic errors in the IC and after a certain temperature the IC can no longer be expected to function properly. Thus, when there is a high computational workload of an IC, there is a desire to ensure that the IC functions properly by controlling the temperature of the IC.

One conventional method for controlling the temperature of an IC includes monitoring the IC's temperature with a thermal sensor and adjusting the speed of a fan directed to a heat sink coupled to the IC accordingly. Another conventional method for controlling the temperature of an IC includes monitoring the IC's temperature and lowering the clock frequency of the IC accordingly when the temperature increases.

However, the computing power of ICs is generally limited by thermal management issues and as such when it is desirable for an IC to be processing at a high computational workload, conventional methods for controlling the temperature of ICs may not allow for adequate temperature control that ensure that the IC functions properly while still meeting the desired high computational workload.

In light of the above, there is a need for improving the way that the temperature of ICs is managed and/or the manner in which ICs are cooled.

SUMMARY

In accordance with a broad aspect, a system for cooling an Integrated Circuit (IC) having at least one surface is provided. The system includes a vessel for holding a coolant in a liquid phase, the at least one surface being thermally coupled to the coolant to transfer heat generated by the IC to the coolant. The coolant and the IC are characterized by a steady-state Critical Heat Flux (CHF) value. The system also includes a controller for periodically increasing a heat flux supplied by the IC to the coolant above the steady-state CHF value followed by a reduction of the heat flux supplied by the IC to the coolant below the steady-state CHF value.

In accordance with another broad aspect, a system for cooling an IC in thermal contact with a coolant in a liquid phase is provided. The system includes at least one sensor for sensing a phase change state of the coolant and for generating a signal and a controller for processing the signal to output a control signal for regulating a heat energy transfer from the IC to the coolant on the basis of the control signal.

In accordance with a further broad aspect, a system for cooling an IC having at least one surface is provided. The system includes a vessel for holding a coolant in a liquid phase, the at least one surface being thermally coupled to the coolant to transfer heat generated by the IC to the coolant. The system also includes a sensor to sense a state of phase change of the coolant and which generates a signal and a controller for adjusting a heat flux supplied by the IC to the coolant in response to the signal.

These and other aspects of the invention will now become apparent to those of ordinary skill in the art upon review of the following description of embodiments of the invention in conjunction with the accompanying drawings.

BRIEF DESCRIPTION OF THE DRAWINGS

A detailed description of embodiments of the invention is provided below, by way of example only, with reference to the accompanying drawings, in which.

It is to be expressly understood that the description and drawings are only for the purpose of illustrating certain embodiments of the invention and are an aid for understanding. They are not intended to be a definition of the limits of the invention.

DETAILED DESCRIPTION

In general, a cooling system is provided for cooling an integrated circuit that is at least in part thermally coupled to a liquid coolant that is held in a vessel. Examples of implementation of invention is illustrated in the annexed drawings and further described below.

The Cooling System

Figure 1A:
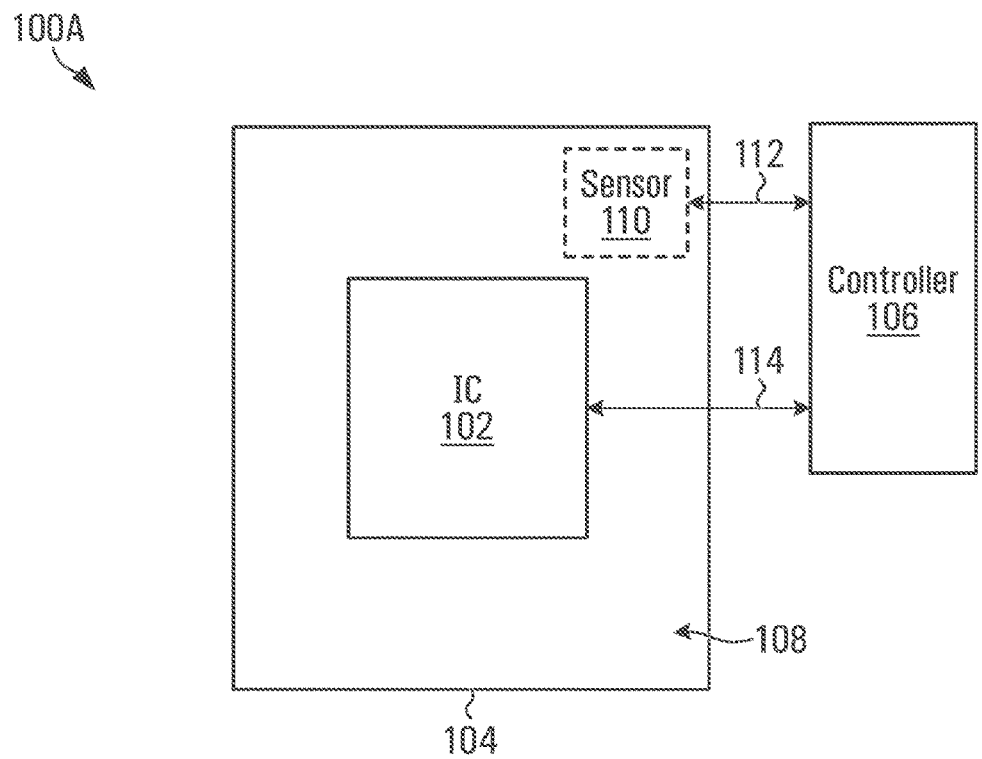
FIG. 1A shows a block diagram of a system for cooling an integrated circuit (IC) in accordance with an embodiment of the invention.

FIG. 1A shows a cooling system 100A for cooling an integrated circuit (IC) 102 in accordance with a specific and non-limiting example of implementation. As shown, the cooling system 100A includes a vessel 104 for holding a coolant 108 in a liquid phase, a controller 106 and an optional sensor 110.

Figure 3A:
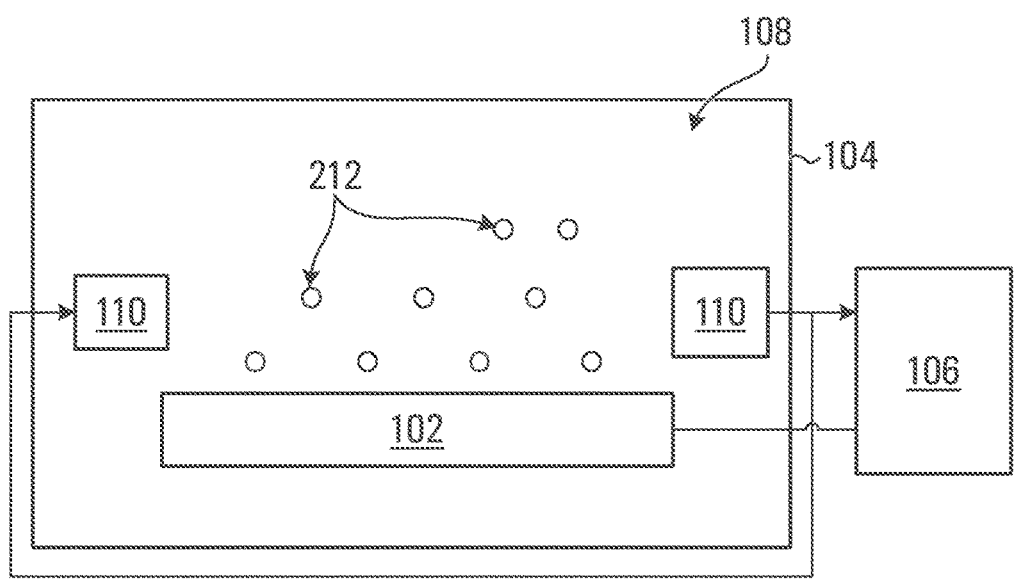
FIG. 3A shows a block diagram of a system for cooling an IC in accordance with an embodiment of the invention.
Figure 3B:
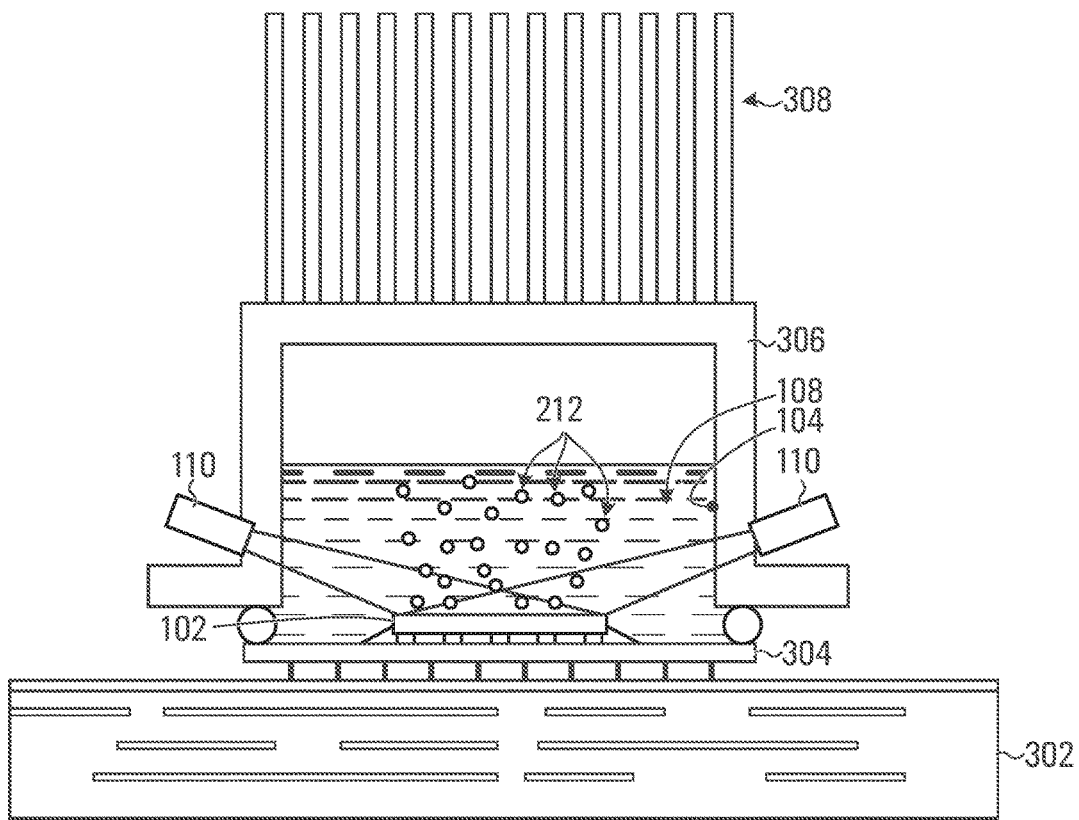
FIG. 3B shows a cross-sectional side view of a system for cooling an IC in accordance with an embodiment of the invention.

The IC 102 may be implemented using any suitable hardware components for implementing a central processing unit (CPU) including a microcontroller, field-programmable gate array (FPGA), application-specific integrated circuit (ASIC), digital signal processor (DSP), graphics processing unit (GPU), any other suitable semiconductor device, or any other suitable device. The IC 102 may be configured such that when it is running (e.g., powered on and in operation) it may process various data. The IC 102 may be suitable for a server, such as in servers running in data centers. When the IC 102 is running, it produces heat based on a number of factors including the voltage level, the clock/frequency speed/rate, and/or the workload of the IC 102. As such, when the IC 102 is running, the temperature of the IC 102 is based at least in part on the heat produced by the IC 102. As the temperature of the IC 102 increases, a critical temperature may be reached, at which the IC 102 must be shut down or throttled down to prevent it from overheating. A specific and non-limiting example of the cooling system 100A is illustrated in FIG. 3B, where the IC 102 is packaged in a module. The module includes the IC 102, a substrate 304, as well as other structural elements (e.g., solder joints, underfill material, etc.). The IC 102 is attached to an electronic device 302, such as a motherboard via a socket (not illustrated). As such, the IC 102 may be associated with various electronic components external to the IC 102 and connected via the electronic device 302.

Referring back to FIG. 1A, the vessel 104 may be made of any suitable material for containing the liquid coolant 108. In some embodiments, the vessel 104 may be made according to the vessel/cooling chamber described in International Publication No. WO 2014/040182, the content of which is hereby incorporated by reference. As shown in the example of FIG. 1A, the IC 102 is immersed in the coolant 108 of the vessel 104. In other examples, not illustrated, the IC 102 may be contained in a module to isolate direct contact of the coolant 108 with the IC 102. The vessel 104 may be made of a metallic component in order to isolate the IC 102 from external electromagnetic interferences or the vessel 104 may be made of a composite material and a suitable electromagnetic shielding, such as copper meshing can be applied on it. In the example of FIG. 3B, the vessel 104 is defined by the inside cavity of a heat sink assembly 306. It is appreciated that, in the example of FIG. 3B, at least part of the IC 102 is in direct contact with coolant 108. It is also appreciated that the size of the vessel 104 may vary in various embodiments. Regardless of the specific means of constructing the vessel 104 and/or the size of the vessel, the vessel 104 is designed for holding a coolant 108 in a liquid phase.

Figure 1B:
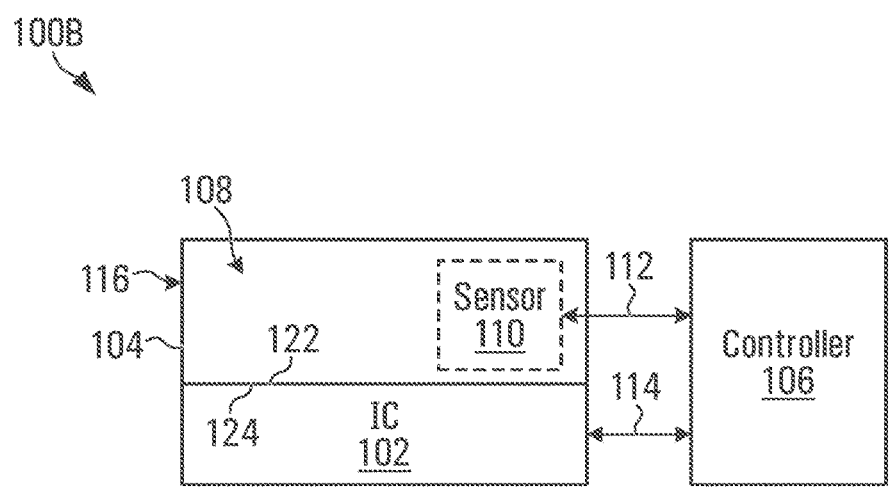
FIG. 1B shows a block diagram of a system for cooling an IC in accordance with an embodiment of the invention.

The liquid coolant 108 may be dielectric to avoid short-circuiting the electrical connections between the IC 102 and the various associated electronic components. In general, at least part or at least one surface of the IC 102 is thermally coupled to the coolant 108 to transfer heat generated by the IC 102 to the coolant 108. Although in the example in FIG. 1A, the IC 102 is immersed in coolant 108 of the vessel 104, in other embodiments such as the one shown in FIG. 1B, a surface 124 of the IC 102 is thermally coupled to the coolant 108 via the surface 122 of the vessel 104 to transfer heat generated by the IC 102 to the coolant 108. It is appreciated that the cooling system 100B of FIG. 1B, is a variant of the cooling system 100A, in which the vessel 104 is coupled to the package structure of the IC 102. In cases where the vessel 104 is coupled to the package structure of the IC 102, a heat sink assembly such as an integrated heat spreader (IHS) may be coupled to the package structure of the IC 102 such that the vessel 104 is coupled to the IHS and/or the coolant 108 is thermally coupled to the IHS.

The liquid coolant 108 can be engineered with a specific boiling point at a temperature selected according to cooling requirements. Since the phase transition from liquid to vapor takes-up a significant amount of energy, the boiling point may be selected to be lower than the maximal operational temperature of the IC 102. In other words, if the temperature of the IC 102 progressively increases, the coolant 108 should start boiling before the point at which the critical temperature is reached and the IC 102 must be shut down or throttled down to prevent it from overheating. The temperature differential, which is the difference between the IC's 102 critical temperature, which is considered to be the upper limit of its operational temperature range and the liquid boiling temperature (e.g., the boiling point), may be determined according to the specifications of the IC 102 and of the coolant 108. It is however preferred that the boiling point of the coolant 108 be below the IC's 102 critical temperature. As such, the coolant 108 has at least one boiling point. The boiling point of the coolant 108 may be relatively low when compared to other liquids. For example, the coolant 108 when compared with water may have a lower boiling point. More specifically, in some embodiments, the maximum boiling point of the coolant is no greater than 90 degree Celsius, in some cases no greater than 80 degree Celsius, in some cases no greater than 70 degree Celsius, in some cases no greater than 60 degree Celsius, and in some cases even less. The chemical sold by 3M under the trademark Novec is an example of coolant 108 that may be used in applications in which the coolant 108 is in direct contact with the electronic circuitry of the IC 102. Coolants with multiple boiling points may be used, as described in International Publication No. WO 2014/040182.

For ease of readability of the rest of this document, unless specified otherwise, reference to the cooling system 100A is to be understood to be reference to the IC 102 associated with the vessel 104 holding the coolant 108 regardless of whether the IC 102 is immersed in coolant 108 of the vessel 104 (e.g., as shown in FIG. 1A) or the IC 102 is coupled to the vessel 104 such that at least one surface of the IC 102 is thermally coupled to the coolant 108 (e.g., as shown in FIG. 1B).

As at least one surface of the IC 102 is thermally coupled to the coolant 108, heat flows from the IC 102 to coolant 108, when the IC 102 is running. This flow of heat from the IC 102 to coolant 108 constitutes heat flux, which is the rate of heat energy transferred through a given surface per unit time.

The controller 106 is configured for controlling various parameters of the cooling system 100A. More specifically, the controller 106 is configured for providing control algorithms for adjusting the heat transfer capabilities of the cooling system 100A. The control algorithms for adjusting the heat transfer capabilities of the cooling system 100A may include controlling one or more control parameters of the cooling system 100A and/or controlling one or more operational parameters of the IC 102 in order to adjust the temperature of the IC 102. As should become more readily apparent later in this document, the controller 106 may be configured for periodically increasing and/or decreasing the heat flux supplied by the IC 102 to the coolant 108. The various aspects that the controller 106 is configured to control are discussed further throughout this document.

Figure 1C:
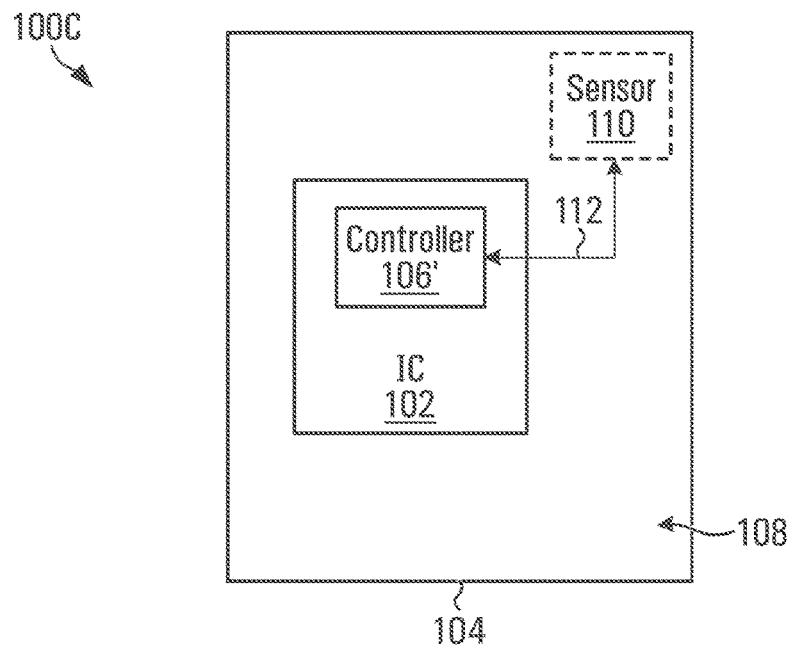
FIG. 1C shows a block diagram of a system for cooling an IC in accordance with an embodiment of the invention.
Figure 1D:
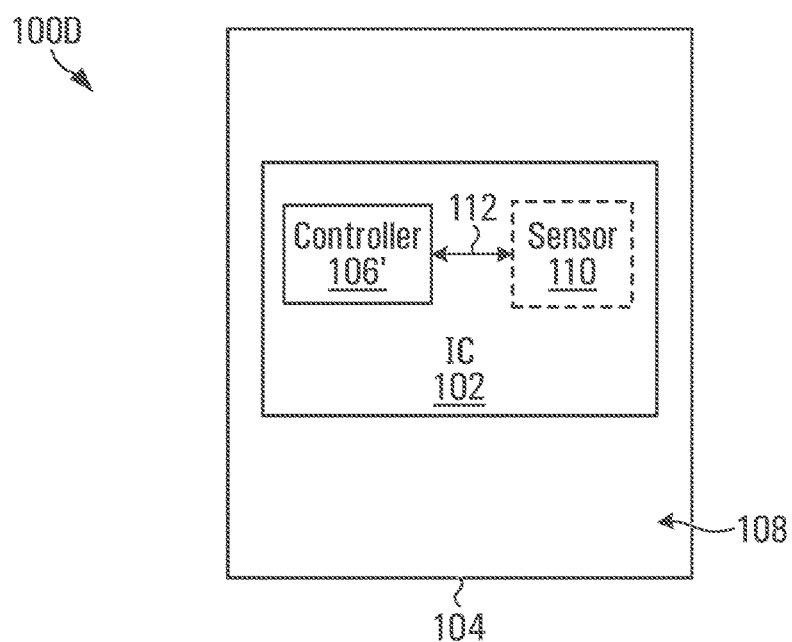
FIG. 1D shows a block diagram of a system for cooling an IC in accordance with an embodiment of the invention.
Figure 2A:
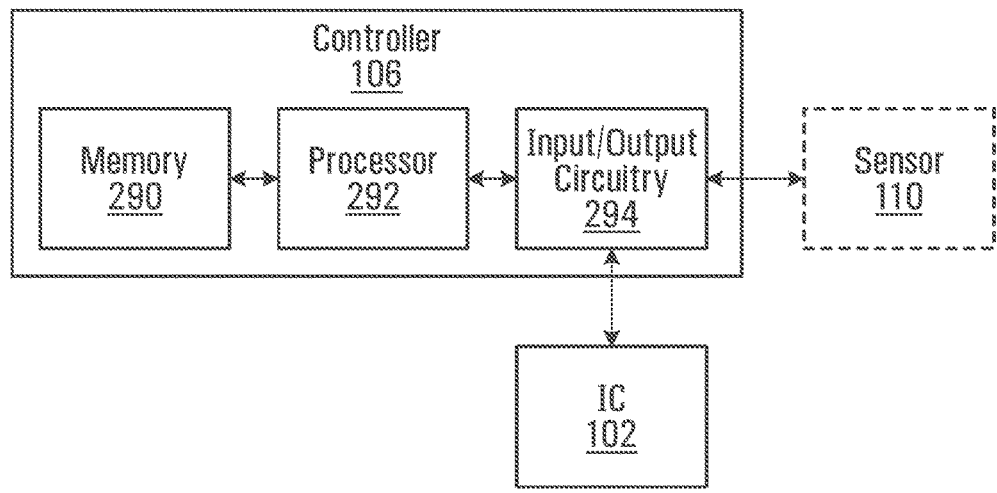
FIG. 2A shows a block diagram of a controller in accordance with a specific and non-limiting example of implementation.
Figure 2B:
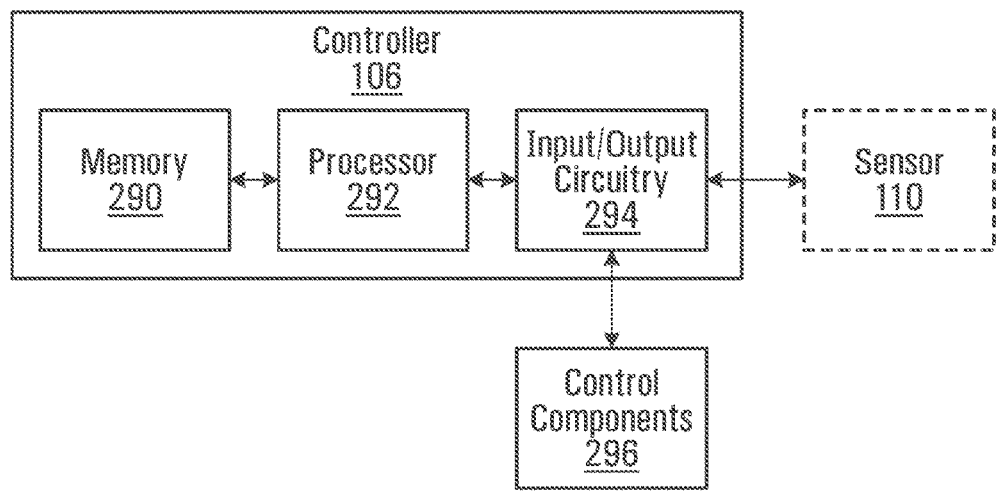
FIG. 2B shows a block diagram of a controller in accordance with a specific and non-limiting example of implementation.
Figure 2C:
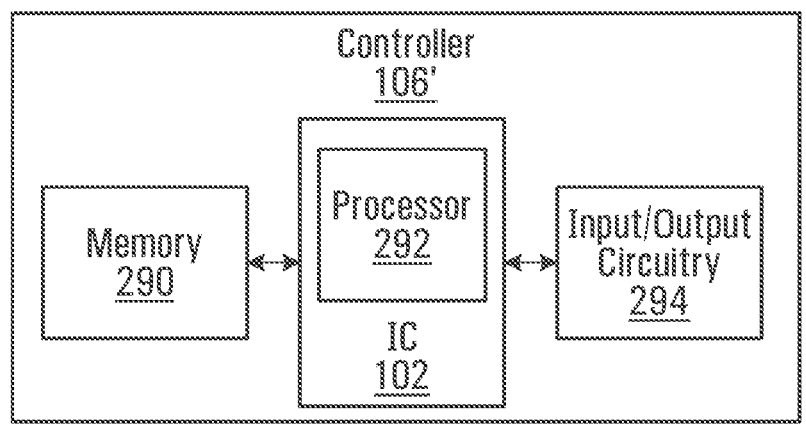
FIG. 2C shows a block diagram of a controller in accordance with a specific and non-limiting example of implementation.

In the examples shown in FIGS. 1A and 1B, the controller 106 is external to the IC 102. In such cases, the controller 106 may be configured as shown in FIGS. 2A and 2B. As shown in FIGS. 2A and 2B, the controller 106 includes a processor 292, computer readable memory 290 and input/output circuitry 294. The processor 292, the computer readable memory 290 and the input/output circuitry 294 may communicate with each other via one or more suitable data communication buses. In the specific and non-limiting examples in FIGS. 2A and 2B, the processor 292 is different from the IC 102; however, in other specific and non-limiting examples of implementation, such as shown in FIG. 2C, the IC 102 includes the processor 292. FIG. 2C illustrates a controller 106', which is a variant of the controller 106 such that the IC 102 includes the processor 292. Although in FIG. 2C, the computer readable memory 290 and the input/output circuitry 294 is shown as external to the IC 102, in other embodiments, the computer readable memory 290 and/or the input/output circuitry 294 are included in the IC 102. It is also appreciated that the controller 106' may be implemented on the IC 102, such as shown in FIGS. 1C and 1D. More specifically, the cooling system 100C of FIG. 1C is a variant of the cooling system 100A, in which the controller 106' is implemented on the IC 102. More specifically, the cooling system 100D of FIG. 1D is a variant of the cooling system 100A, in which the controller 106' is implemented on the IC 102 and where the sensor 110 is implemented on the IC 102.

Although the controller 106 is illustrated and discussed in this document as a digital controller, the controller 106 may be implemented as an analog controller in other embodiments. The analog controller may include various electronic components that typically would not include the processor 292 and the computer readable memory 290. In other words, the controller 106 may be implemented to perform analog signal processing which is conducted on continuous analog signals by some analog means (as opposed to the discrete digital signal processing where the signal processing is carried out by a digital process). It is appreciated that the controller 106 may include both analog and digital components in various implementations of the controller 106.

For ease of readability of the rest of this document, unless specified otherwise, reference to the cooling system 100A is to be understood to be reference to the controller 106 regardless of whether the controller 106 is implemented external to the IC 102 (e.g., as shown in FIGS. 1A and 1B) or the controller 106' (and/or the processor 292) is implemented on the IC 102 (e.g., as shown in FIGS. 1C and 1D).

Turning now to the structure of the controller 106, the computer readable memory 290 may be any type of non-volatile memory (e.g., flash memory, read-only memory (ROM), magnetic computer storage devices or any other suitable type of memory) or semi-permanent memory (e.g., random access memory (RAM) or any other suitable type of memory). Although only a single computer readable memory 290 is illustrated, the controller 106 may have more than one computer readable memory module. The computer readable memory 290 stores program code and/or instructions, which may be executed by the processor 292. The program code and/or instructions executable by the processor 292 may include software implementing control algorithms for adjusting the heat transfer capabilities of the cooling system 100A (e.g., increasing and/or decreasing the heat flux supplied by the IC 102 to the coolant 108). The computer readable memory 290 may also include one or more databases for the storage of data.

The processor 292 may be implemented using any suitable hardware component for implementing a central processing unit (CPU) including a microcontroller, field-programmable gate array (FPGA), application-specific integrated circuit (ASIC), digital signal processor (DSP), integrated circuit (IC), graphics processing unit (GPU) or any other suitable device. The processor 292 is in communication with the computer readable memory 290, such that the processor 292 is configured to read data obtained from the computer readable memory 290 such as information pertaining to the control algorithms and execute instructions stored in the computer readable memory 290 such as defined by the control algorithms for adjusting the heat transfer capabilities of the cooling system 100A. Although only a single processor 292 is illustrated, it is appreciated that more than one processor may be used.

The controller 106 may runs an operating system stored in the computer readable memory 290 such as Android, iOS, Windows 7, Windows 8, Linux and Unix operating systems, to name a few non-limiting possibilities. The processor 292 may execute instructions stored in the computer readable memory 290 to run the operating system such that the control algorithms for adjusting the heat transfer capabilities of the cooling system 100A can then be executed. It is appreciated that the controller 106 may be adapted to run on operating systems that may be developed in the future.

The input/output circuitry 294 may be used to communicate with the IC 102. That is, the controller 106 may transmit or receive signals via the input/output circuitry 294 to or from the IC 102. The transmitted signals from the controller 106 to the IC 102 may be one or more control signals that include control information for controlling at least one operational parameter (e.g., clock frequency, supply voltage, number of active cores, etc.) of the IC 102 that controls a rate of heat energy produced by the IC 102 and more specifically for increasing and/or decreasing the heat flux supplied by the IC 102 to the coolant 108. In other words, the control signal from the controller 106 to the IC 102 may be used to control at least one operational parameter of the IC 102 in order to control the temperature of the IC 102. The input/output circuitry 294 may also be used to communicate with the sensor 110. That is, the controller 106 may transmit or receive signals via the input/output circuitry 294 to or from the sensor 110. The received signals at the controller 106 from the sensor 110 may include information pertaining to measurements taken by the sensor 110. The input/output circuitry 294 may optionally be also used to communicate with control components 296. That is, the controller 106 may transmit or receive signals via the input/output circuitry 294 to or from the control components 296. The control components 296 may be used to adjust at least one operational parameter of the cooling system 100A that controls the rate of heat energy absorbed by the coolant 108. The transmitted signals from the controller 106 to the control components 296 may include control information for controlling at least one operational parameter of the cooling system 100A that controls the rate of heat energy absorbed by the coolant 108.

The optional sensor 110 may include one or more optical, acoustic, temperature, pressure, conductivity sensors and/or any other suitable sensors. The sensor 110 may measure various characteristics of the cooling system 100A. More specifically, the sensor 110 may be used to measure a state and/or phase change such as a state of the coolant 108 or various properties of the coolant 108 at the surface of the vessel 104 adjacent to the IC 102 or on the surface of the IC 102.

For example, the sensor 110 may monitor the boiling of the liquid near the surface of the IC 102. In particular, the sensor 110 observes the state of phase change of coolant from liquid to gas, by determining the morphology of the bubbles generated at the surface of the IC 102. This could include measuring the bubble density, such as the mean number of bubbles per unit area or the area of the IC surface that is occupied by bubbles. In other words, the sensor 110 may be a boiling monitor. A first example of a boiling monitor includes having a light source on one side of the surface of the IC 102, where a detector measures the amount of light from the light source being transmitted through the boiling liquid. The light source could be a LED, a LED collimated with a lens, or a laser. A second example of a boiling monitor includes having a camera with a lens assembly to image the surface of the IC 102. Image processing software measures the density of bubbles or the area of bubbles on the IC 102. The lens assembly could have a relatively shallow focal depth so that bubbles that have detached from the surface of the IC 102 do not appear sharply in the image. A third example of a boiling monitor is having an ultrasound emitter sending a pulse into the liquid and an ultrasound receiver measures the amplitude or time of arrival of the pulse. The pulse could propagate at a grazing angle to the surface of the IC 102 or it could come at a substantially sharper angle and be reflected by the surface.

The sensor 110 may be a temperature sensor. The temperature sensor may be located on the IC 102 for measuring the temperature of the IC 102, may be located in the vessel 104 for measuring the coolant 108, or located both on the IC 102 and in the vessel 104. For example, the temperature sensor may be positioned near the surface of the IC 102 and used to measure the surface temperature of the IC 102 or the temperature of the coolant near the surface of the IC 102.

The sensor 110 may be a pressure sensor for measuring the pressure of the coolant 108 within the vessel 104. This embodiment requires a closed vessel 104 designed to allow a pressure build-up when coolant boils.

Irrespective of its specific implementation, the sensor 110 is configured to sense a state of phase change of the coolant 108 and to generate a signal, which is transmitted to the controller 106 indicative of the state of phase change of the coolant 108. The received signal from the sensor 110 to the controller 106, is then processed by the controller 106 to generate the control signal to the IC 102 for regulating the transfer of thermal energy between the IC 102 and the coolant 108.

The cooling system 100A may also include other components not shown in the block diagram of FIG. 1A, such as mechanisms for installing/removing the IC 102 from the vessel 104, mechanism for controlling the pressure of the coolant 108 in the vessel 104, mechanisms for inducing a liquid flow within the vessel and/or near the surface of the IC 102 and/or mechanisms for vibrating the IC 102 in the vessel 104. Such aforementioned mechanisms may be controllable via the control components 296 by control signals from the controller 106.

It is further appreciated that the cooling system 100A may be implemented in various forms and that the examples given above are only some examples of implementation of the cooling system 100A.

Heat Flow from IC to Coolant

Figure 4A:
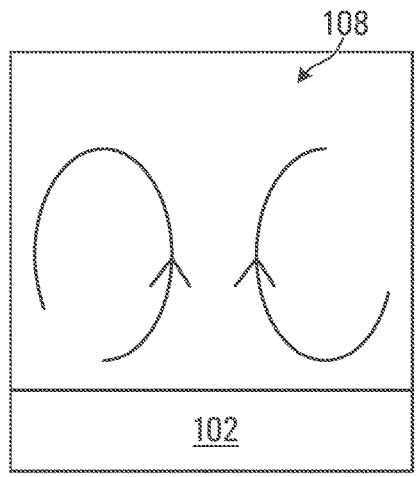
FIGS. 4A, 4B, 4C and 4D show various states of a coolant in accordance with an embodiment of the invention.
Figure 4B:
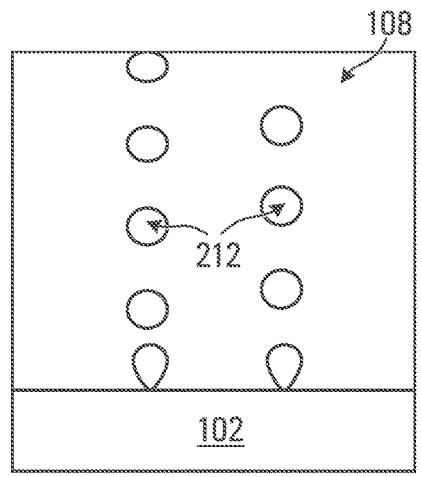
Figure 4C:
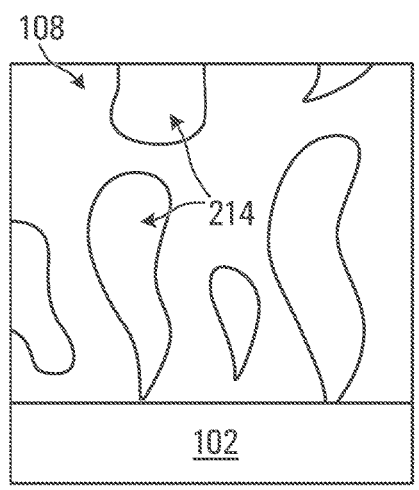
Figure 4D:
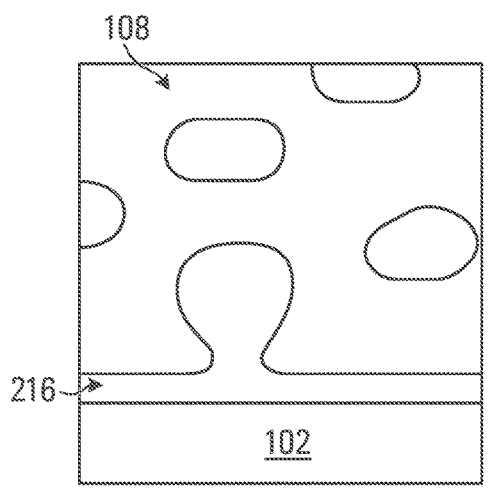
Figure 5:
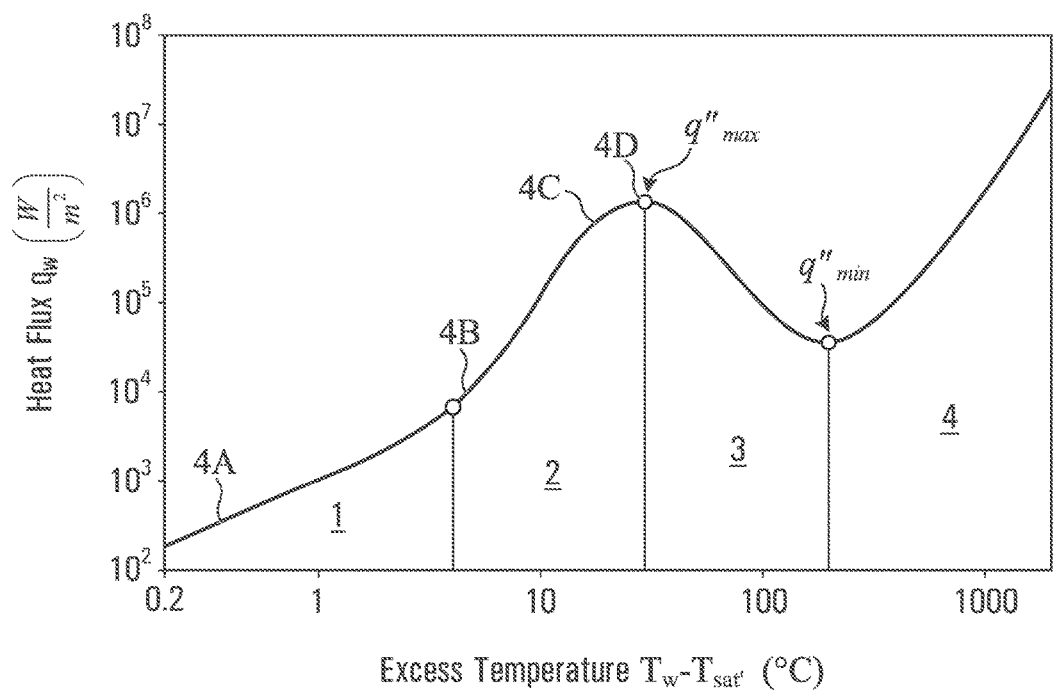
FIG. 5 illustrates a steady state heat flux curve.

The heat flow mechanics from the IC 102 to the coolant 108 will now be described by reference to FIGS. 4A to 4D and FIG. 5. FIGS. 4A to 4D illustrate specific and non-limiting examples of the coolant 108 in various states of phase change as heat flows from the IC 102 to the coolant 108. FIG. 5 illustrates a specific and non-limiting example of a heat flux curve for the heat transfer from the IC 102 to the coolant 108. Heat flux is the rate of heat energy transfer through a given surface per unit time, in this example heat flux is the rate of heat energy transferred through the surface of the IC 102 per unit time. The x-axis of the graph in FIG. 5 is the excess temperature, $T_w\text{-}T_{sat'}$ (in Celsius), where $T_w$ is the surface temperature of the IC 102 and $T_{sat'}$ is saturated fluid temperature of the coolant 108, and the y-axis of the graph is the heat flux, $q_w''$ (W/m$^2$). The excess temperature corresponds to a difference between the surface temperature of the IC 102 in relation to a saturated fluid temperature of the coolant 108. FIG. 5 shows four regions 1, 2, 3 and 4, where in the first region 1 natural heat convection occurs, which is illustrated in FIG. 4A. Then in region 2, nucleate boiling occurs. Nucleate boiling is a type of boiling that takes place when the surface temperature of the IC 102 is hotter than the saturated fluid temperature of the coolant 108 by a certain amount. At first isolated bubbles 212 occur, as shown in FIG. 4B, and then as the excess temperature increases columns and slugs 214 occur, as shown in FIG. 4C. Then at the burnout point, $q_{max}''$ the bubbles collapse into a substantially continuous dry film 216, leading to a dry IC 102, which is shown in FIG. 4D. In region 3, transition boiling occurs which may include unstable film and partial nucleate boiling and then in region 4, film boiling occurs.

Considering FIGS. 4A to 4D and FIG. 5 in further detail, thermal energy is directed from the IC 102 to the adjoining liquid coolant 108 and defines the heat flux from the IC 102 into the coolant 108. At first, thermal energy that is directed from the IC 102 to the adjoining liquid coolant 108, which has the effect of elevating the temperature of the liquid coolant 108 via convection heat transfer. FIG. 4A illustrates an example where convection heat transfer from the IC 102 to the coolant 108 is occurring. When heat flows from the IC 102 to the coolant 108, the temperature of the coolant 108 increases, to the point where vapor bubbles 212 nucleate at the surface of the IC 102, as shown in FIG. 4B. As such, a phase change occurs that takes up the thermal energy from the IC 102. In other words, when the temperature of the IC 102 exceeds the boiling point of the liquid coolant 108, it causes the liquid coolant 108 to evaporate. The latent heat of vaporization associated with this phase transition helps increase the magnitude of the heat flow from the IC 102 to the liquid coolant 108 beyond the heat flow due to convection. This process is most efficient when the bubbles 212 nucleate easily, and when they also detach easily. After detachment, the bubbles 212 generally rise in the liquid coolant 108 (due to buoyancy forces), and therefore contribute to transporting heat away from the IC 102. A number of regimes can thus be observed in the cooling process: (i) at low IC surface temperatures, bubbles do not form, and heat is transported by convection in the liquid coolant 108 (e.g., as in FIG. 4A); (ii) as the IC surface temperature increases, bubbles nucleate and detach at an increasing rate, leading to efficient heat transfer (e.g., as in FIG. 4B); (iii) the density of bubbles on the IC surface becomes large at higher IC surface temperatures (e.g., as in FIG. 4C), and the bubbles collapse to form a continuous film (e.g., as in FIG. 4D), leading to a dry IC surface and less efficient heat transfer; (iv) at very high temperatures, conduction and radiation heat transfer through the vapor film eventually lead to high heat fluxes again. The maximum heat flux at the end of regime (iii) is called the "critical heat flux" (CHF), indicated by $q_{max}$" in FIG. 5. Passed that operational point, the heat flux decreases as the excess temperature increases. It is essentially a thermal runaway condition where heat is no longer efficiently removed from the IC surface, which can damage the IC.

The specific critical heat flux value for the setup shown in 3B for instance is defined by the setup parameters, such as the physical properties of the coolant 108, the characteristics of the surface (e.g., the at least one surface of the IC 102 that is thermally coupled to the coolant 102 or the IHS, if one is used) and the ambient pressure among others.

The CHF shown in FIG. 5 by $q_{max}$" corresponds to heat flux measured in a steady-state situation, where power has been applied to the IC 102 for a long enough time for the heat flux to have stabilized. In transient conditions, heat transfer inertia between the heat input of the IC 102 and the response of the liquid coolant 108 exists. This heat transfer inertia defines a window of time during which the heat flux can exceed the steady-state CHF value without creating a burnout. In other words, during that window the coolant 108 is able to absorb the heat flux, which exceeds the steady-state CHF value for the particular setup, but without the bubbles collapsing to form a dry surface. As such, one aspect of some embodiments described herein is to periodically increase the heat output produced by the IC 102 in order to temporarily produce a heat flux above the steady-state CHF value. The heat output of the IC 102 is then lowered, but before a burn out occurs. The process can be repeated indefinitely.

The heat flux is a value that cannot be readily measured. However, the heat flux can be correlated to the temperature of the IC 102 surface. For a given setup, the heat flux can be computed and the temperature at which the CHF occurs, determined. Then by monitoring the temperature of the IC 102 surface, one can determine the operational point relative to the CHF. With reference to regions 1 and 2 in FIG. 5, as the temperature of the IC 102 increases the steady-state heat flux of the IC 102 into the coolant 108 also increases until a maximum is reached; thereafter, as the temperature of the IC 102 increases the steady-state heat flux of the IC 102 into the coolant 108 decreases, as shown in region 3 in FIG. 5. As such, an aspect of some embodiments described herein is to monitor the surface temperature of the IC 102 and manage the operational parameters of the IC 102 based on the identified surface temperature of the IC 102 at which CHF is reached.

Similarly, the CHF can also be derived from other parameters than the setup, such as for instance the morphology of the bubbles at the surface of the IC 102, as it is discussed below.

Figure 6:
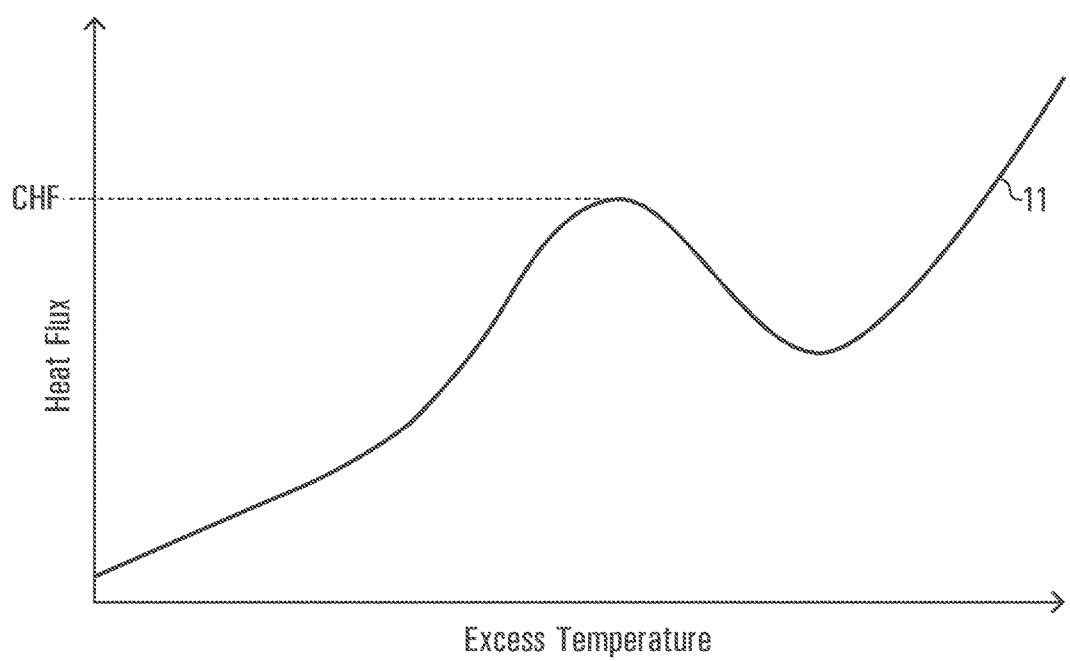
FIG. 6 illustrates a steady state heat flux curve.

FIG. 6 illustrates an example of a steady-state heat flux curve 11. Higher heat fluxes may be achieved in a transient state versus a steady-state and in particular a heat flux that is above the steady-state heat flux curve 11 and above the steady-state CHF value may be achieved by operating the IC 102 in a transient (non-stationary) condition.

Operating the IC for Transient Heat Flow

The controller 106 may be programmed to take advantage of the heat transfer inertia between the heat input of the IC 102 and the response of the liquid coolant 108. Accordingly, the temperature of the IC 102 may be adequately controlled in spite the fact that the heat flux is temporarily above the steady-state CHF value. At or near the end period of the time window defined by the heat inertia, where the heat flux exceeds the steady-state CHF, the heat flux is lowered below the steady-state CHF value such as to prevent burnout. Therefore, by periodically increasing the heat flux to the coolant 108 and then decreasing it, it is possible to transfer an increased amount of thermal energy to the coolant 108, as an average. With reference to FIG. 6, by periodically increasing the heat flux to the coolant 108 and then decreasing it is possible to transfer an increased heat flux that is above the steady-state heat flux curve 11 and in particular is above the steady-state CHF value.

The control of the heat flux of the IC 102 into the coolant 108 may be implemented as temperature control of the IC 102 in one example of implementation. For example, the surface temperature of the IC 102 at which steady state CHF is achieved may be known (e.g., by previous measurements or testing) and based on this, the operational parameters of the IC 102 may be controlled such that a first desired surface temperature of the IC 102 is achieved, where the first desired surface temperature of the IC 102 is below the temperature at which steady-state CHF is achieved. Then, the operational parameters of the IC 102 may be controlled such that a second desired surface temperature of the IC 102 is achieved, where the second desired surface temperature of the IC 102 is above the first desired surface temperature of the IC 102 and above the temperature at which steady-state CHF is achieved. Further, the operational parameters of the IC 102 are controlled such that the second desired surface temperature of the IC 102 is maintained for a specified period of time. After the specified period of time, the operational parameters of the IC 102 may be controlled to return the surface temperature of the IC back to the first surface temperature of the IC 102. The first desired surface temperature of the IC 102, the second desired surface temperature of the IC 102 and the specified period of time at which the second desired surface temperature of the IC 102 is maintained may be determined by previous measurements and/or testing. In other words, the selection of the two temperatures to periodically fluctuate between and the duration of time between temperature fluctuations may be determined through testing that is specific to the IC 102 and the coolant 108. In one example of implementation, the temperature of the IC is cycled rapidly between a low temperature and a higher temperature, so that the dry film condition is never fully reached.

It is appreciated that when the heat flux into the coolant 108 from the IC 102 fluctuates over time, the heat transfer process is expected to be different than in the steady-state situation. As such, when the power of the IC 102 is increased rapidly, via control signals from the controller 106, from a lower value to a larger value this may put the coolant 108 in the nucleate boiling regime and, for instance, a delay may be observed before boiling starts, resulting in an initially smaller heat flux into the coolant 108. The steady-state heat flux is reached sometime after the power has stabilized and bubbles have started nucleating and detaching at a regular rate. Similarly, a heat flux above the steady-state CHF value can be achieved for a brief period of time if the power is increased from below the steady-state CHF value to a value above it, and is lowered to a value below the steady-state CHF before the bubbles on the surface of IC 102 have had a chance to collapse into a continuous film.

Figure 15:
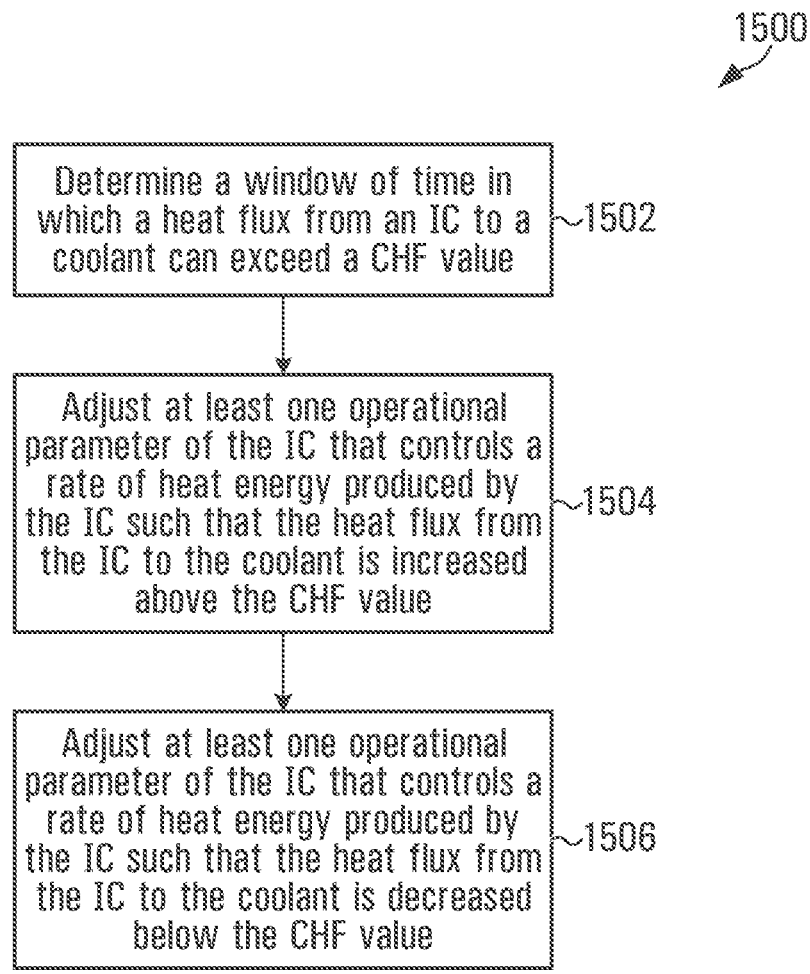
FIG. 15 shows a flowchart for periodically adjusting a rate of heat energy produced by an IC in accordance with an embodiment of the invention.

FIG. 15 shows a flowchart 1500 for periodically adjusting a rate of heat energy produced by the IC 102 in accordance with an embodiment of the invention. At step 1502, the window of time and excess heat flux above the CHF value is determined by the controller 106. This step may be done by obtaining this information from the computer readable memory 290. At step 1504, at least one operational parameter of the IC 102 that controls the rate of heat energy produced by the IC 102 and that determines the heat flux from the IC 102 to the coolant 108 is increased to drive the heat flux above the CHF value. Such adjusting may include the controller 106 sending control signals to the IC 102 and the IC 102, in response to the received control signals, adjusting the rate of heat energy produced by the IC 102 accordingly. At step 1506, at least one operational parameter of the IC 102 that controls the rate of heat energy produced by the IC 102 such that the heat flux from the IC 102 to the coolant 108 is decreased below the steady-state CHF value is adjusted. Such adjusting may include the controller 106 sending control signals to the IC 102 and the IC 102, in response to the received control signals, adjusting the rate of heat energy produced by the IC 102 accordingly. As such, the controller 106 is configured such that it causes the heat flux supplied by the IC 102 to the coolant 108 to be periodically increased above the steady-state CHF value followed by a reduction of the heat flux supplied by the IC 102 to the coolant 108 below the steady-state CHF value. The controller 106 can determine the operational point with relation to the CHF value by sensing the surface temperature of the IC 102. The operational parameter of the IC that is adjusted in flowchart 1500 may be the clock frequency of the IC 102, number of active cores of the IC 102, the specific cores of the IC 102 that are activated or deactivated (e.g., cores 1 and 2 vs cores 3 and 4), and/or supply voltage of the IC 102. In other words, the heat flux of the IC 102 into the coolant 108 may be varied by adjusting a clock frequency of the IC 102, by selectively activating or de-activating cores of the IC 102 and/or by adjusting a supply voltage of the IC 102.

It is appreciated that by controlling the clock frequency of the IC 102, by selectively activating or de-activating cores of the IC 102 and/or by adjusting a supply voltage of the IC 102 the surface temperature of the IC 102 may be controller. As such, based on known characteristics of the IC 102 and the coolant 108, based on previous measurements obtained by testing the IC 102 and the coolant 108, based on some direct measurement of the surface temperature of the IC 102 (e.g., with use of sensors) and/or some combination of above, that the specific clock frequency of the IC 102, the specific number and particular activate or de-activate cores of the IC 102 and/or the specific supply voltage of the IC 102, may be determined for achieving the desired surface temperature of the IC 102.

As the controller 106 may be configured for adjusting at least one operational parameter of the IC 102 (e.g., clock frequency, supply voltage, number of active cores) that controls a rate of heat energy produced by the IC, the controller 106 may be configured via the processor 292 to run control algorithms being stored as instructions in the computer readable memory 290. The processor 292 when executing the instructions corresponding to the control algorithms, cause the controller 106 to send control signals to the IC 102, which may be via the input/output circuitry 294. These control signals may cause the heat flux from the IC 102 to the coolant 108 to be periodically increased above the steady-state CHF value followed by a reduction of the heat flux supplied by the IC 102 to the coolant 108 below the steady-state CHF value.

It is appreciated that the IC 102 and the coolant 108 may be characterized by a threshold heat flux. In some cases, the threshold heat flux may be the steady-state CHF and in other cases the threshold heat flux is below the steady-state CHF. The controller 106 may then periodically increase the heat flux supplied by the IC 102 in to the coolant 108 above the threshold heat flux value followed by a reduction of the heat flux supplied by the IC 102 to the coolant 108 below the threshold heat flux value. Although in the embodiments described above the controller 106 is described in controlling the heat flux of the IC 102 into the coolant 108 in relation to a steady-state CHF value, in other embodiments controlling the heat flux of the IC 102 into the coolant 108 is in relation to the threshold heat flux value.

Managing the Heat Transfer from IC to Coolant Via Use of Sensor

Another aspect of the controller 106 is that it may be configured to manage the heat transfer from the IC 102 to liquid coolant 108 by monitoring the state of phase change of the liquid coolant 108 into gas. The sensor 110 is used to find out the state of phase change of the coolant 108. The sensor 110 may measure optical, acoustic, temperature, pressure or conductivity parameters and generates a signal, which conveys phase change information. The phase change information signal is processed by the controller 106 to derive a control signal, which varies one or more parameters of the cooling system 100A on the basis of the observed phase change state. For instance, one controlled parameter is the heat input, in other words the heat released by the IC 102. The amount of heat can be managed by changing the frequency of the IC 102, performing selective core de-activation or varying the supply voltage of the IC 102. Another controlled parameter is the ability of the coolant to take-up heat. For instance, to increase the heat intake, an active cooling action can be implemented, such as creating a forced liquid flow across the surface of the IC 102 to prevent formation of a dry film. Another active cooling option is to induce vibrations on the IC surface to facilitate bubble release. Yet another active cooling option is to pressurize the vessel 104 containing the coolant 108 such as to control the boiling point of the coolant 108; by increasing the pressure, the bubble release from the IC surface is made less intense, hence the formation of a dry film is less likely.

By way of a specific and non-limiting example, the sensor 110 may be a boiling monitor that is used to measure the density of bubbles on the surface of the IC 102. FIGS. 3A and 3B illustrate the cooling system 100A for cooling the IC 102 in accordance with embodiments of the invention, where the sensor 110 is configured to measure the density of bubbles on the surface of the IC 102. The sensor 110 provides a signal to the controller 106 indicative of the density of bubbles on the surface of the IC 102. The controller 106 may then process the received signal from the sensor 106 to adjust a control algorithm that determines the amount of power generate by the IC 102. For instance, the control algorithm may cause the controller 106 to send control signals to the IC 102 and/or to the control components 296 to adjust one or more parameters of the cooling system 100A. More specifically, the control signal may be a control signal to adjust at least one parameter of the IC 102 such as changing the frequency of the IC 102, performing selective core de-activation and/or varying the supply voltage of the IC 102. The control signal may also or alternatively be a control signal to adjust at least one control parameter of the cooling system 100A such as creating a forced liquid flow across the surface of the IC, induce vibrations on the IC surface and/or adjust the pressure of the coolant 108 within the vessel 104. The control algorithm may allow the IC 102 to operate at a power level that is above the CHF, until sensor 110 detects that the bubble film on the IC is about to collapse. When such condition is detected, the control algorithm may adjust the at least one control parameter of the cooling system 100A so the IC's heat flux is below the CHF for a sufficient period of time for the film to return to a stable condition. The algorithm may also be adjusted to maintain a specific density of bubbles that is optimal for a specific application of running the IC 102. It is appreciated that such control algorithm may allow for the controller 106 to operate the heat flux of the IC 102 into the coolant 108 to be very close to the CHF, at the CHF value or periodically above the steady-state CHF value.

Figure 7:
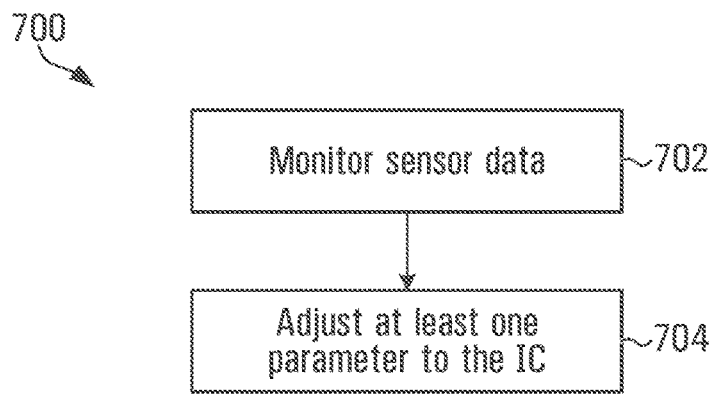
FIG. 7 shows a flowchart for adjusting at least one parameter of an IC in accordance with an embodiment of the invention.

FIG. 7 shows a flowchart 700 for adjusting at least one parameter of the IC 102 in accordance with an embodiment of the invention. At step 702, the controller 106 monitors the signals received from the sensor 110 such that it processes the received signal conveying sensor data from the sensor 110 to determine if a parameter of the IC 102 should be adjusted to control the heat released by the IC 102. At step 704, based on the determination made at step 702, the controller 106 adjusts at least one parameter of the IC 102, where the at least one parameter may be clock frequency of the IC 102, the number of cores, and/or input voltage of the IC 102. The flowchart 700 may more specifically follow the process in any of FIG. 8, 9 or 10, discussed below.

Figure 8:
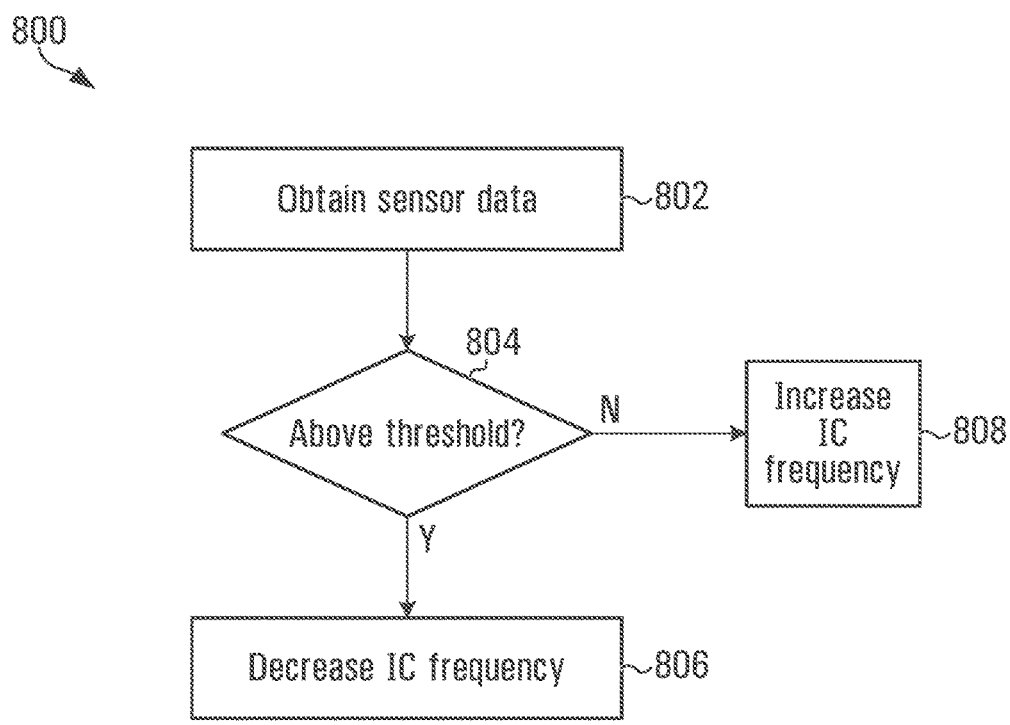
FIG. 8 shows a flowchart for adjusting a frequency of an IC in accordance with an embodiment of the invention.

FIG. 8 shows a flowchart 800 for adjusting a frequency of the IC 102 in accordance with an embodiment of the invention. At step 802, the sensor data from the sensor 110 is processed by the controller 106 and at step 804 it is compared to a threshold value to see if the clock frequency of the IC 102 should be increased (step 808) or decreased (step 806). For example, the sensor data may include information pertaining to the state of the coolant 108 adjacent to the surface of the IC 102. The measured state of the coolant 108 may then be compared by the controller 106 to a look-up table stored in the memory 290 to determine a desirable clock frequency of the IC 102. The look-up table may list suitable clock frequencies for the IC 102 based on respective states of the coolant 108.

Figure 9:
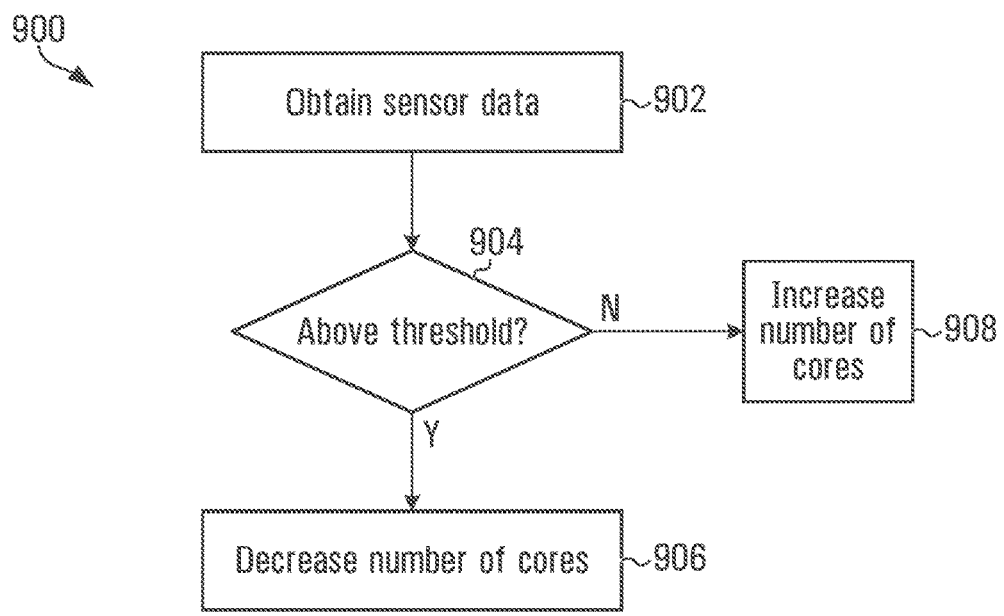
FIG. 9 shows a flowchart for adjusting a number of cores of an IC in accordance with an embodiment of the invention.

FIG. 9 shows a flowchart 900 for adjusting a number of cores of the IC 102 in accordance with an embodiment of the invention. At step 902, the sensor data from the sensor 110 is processed by the controller 106 and at step 904 it is compared to a threshold value to see if the number of active cores of the IC 102 should be increased (step 908) or decreased (step 906). For example, the sensor data may include information pertaining to the state of the coolant 108 adjacent to the surface of the IC 102. The measured state of the coolant 108 may then be compared by the controller 106 to a look-up table stored in the memory 290 to determine a desirable number of active cores and/or the specific cores to activate or deactivate. The look-up table may list suitable number of active cores and/or which specific cores to be activated or deactivated of the IC 102 based on respective states of the coolant 108. It is appreciated that moving the workload from one core of the IC 102 to another core may require one or more sensors for monitoring each of the cores of the IC 102, such that output signals from the one or more sensors may then be processed by the IC 102 and/or the controller 106 to determine which of cores to activate or deactivate.

Figure 10:
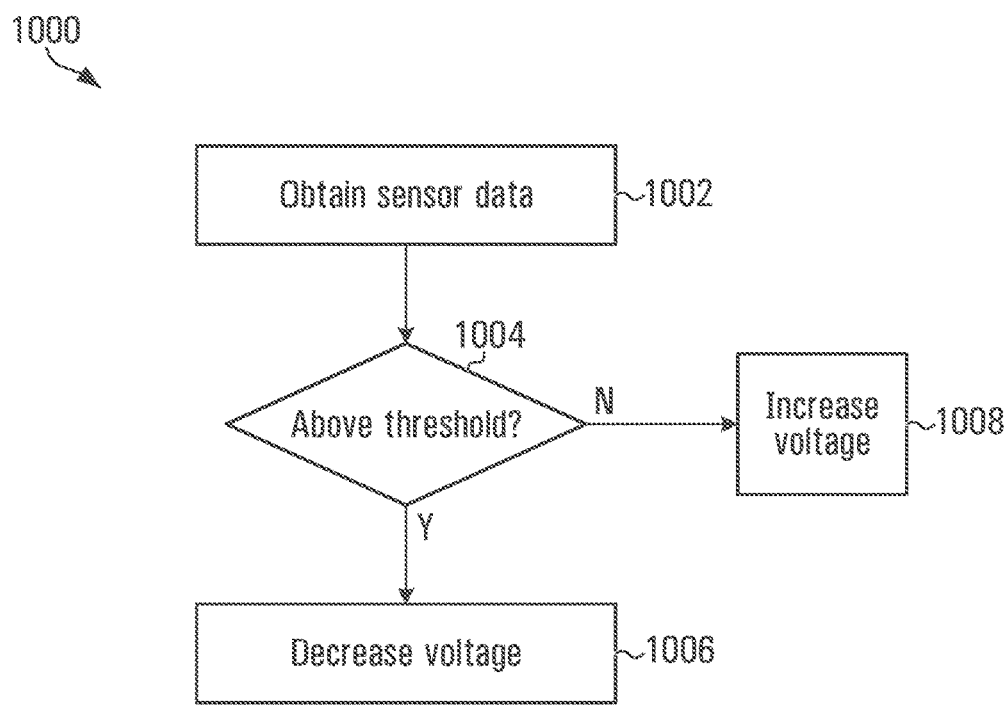
FIG. 10 shows a flowchart for adjusting voltage of an IC in accordance with an embodiment of the invention.

FIG. 10 shows a flowchart 1000 for adjusting voltage of the IC 102 in accordance with an embodiment of the invention. At step 1002, the sensor data from the sensor 110 is processed by the controller 106 and at step 1004 it is compared to a threshold value to see if the voltage of the IC 102 should be increased (step 1008) or decreased (step 1006). For example, the sensor data may include information pertaining to the state of the coolant 108 adjacent to the surface of the IC 102. The measured state of the coolant 108 may then be compared by the controller 106 to a look-up table stored in the memory 290 to determine a desirable supply voltage for the IC 102. The look-up table may list suitable supply voltages for the IC 102 based on respective states of the coolant 108.

Figure 11:
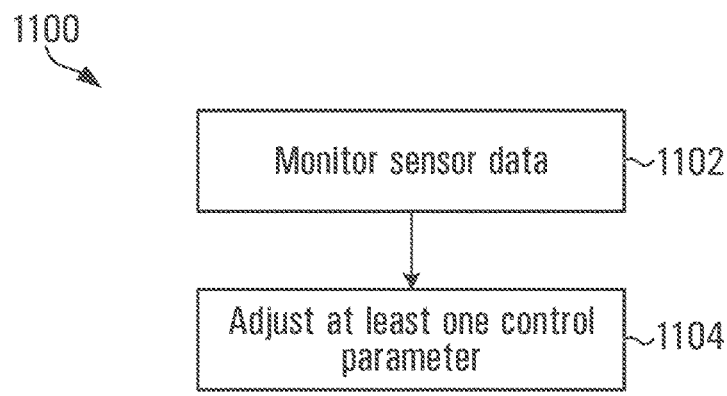
FIG. 11 shows a flowchart for adjusting a control parameter of a cooling system in accordance with an embodiment of the invention.

FIG. 11 shows a flowchart 1100 for adjusting a control parameter of the cooling system 100A in accordance with an embodiment of the invention. At step 1102, the controller 106 monitors the sensor 110 such that it receives a signal conveying sensor data from the sensor 110 and then processes the sensor data to determine if a control parameter of the cooling system 100A should be adjusted to manage the heat released by the IC 102. At step 1104, based on the determination made at step 1102, the controller 106 adjusts at least one control parameter of the cooling system 100A, where the at least one control parameter may be the pressure of the coolant 108, an amount of vibrations on the IC to facilitate bubble release and/or the amount flow of the coolant 108 in the vessel 104. The flowchart 1100 may more specifically follow the process in any of FIG. 12, 13 or 14, discussed below.

Figure 12:
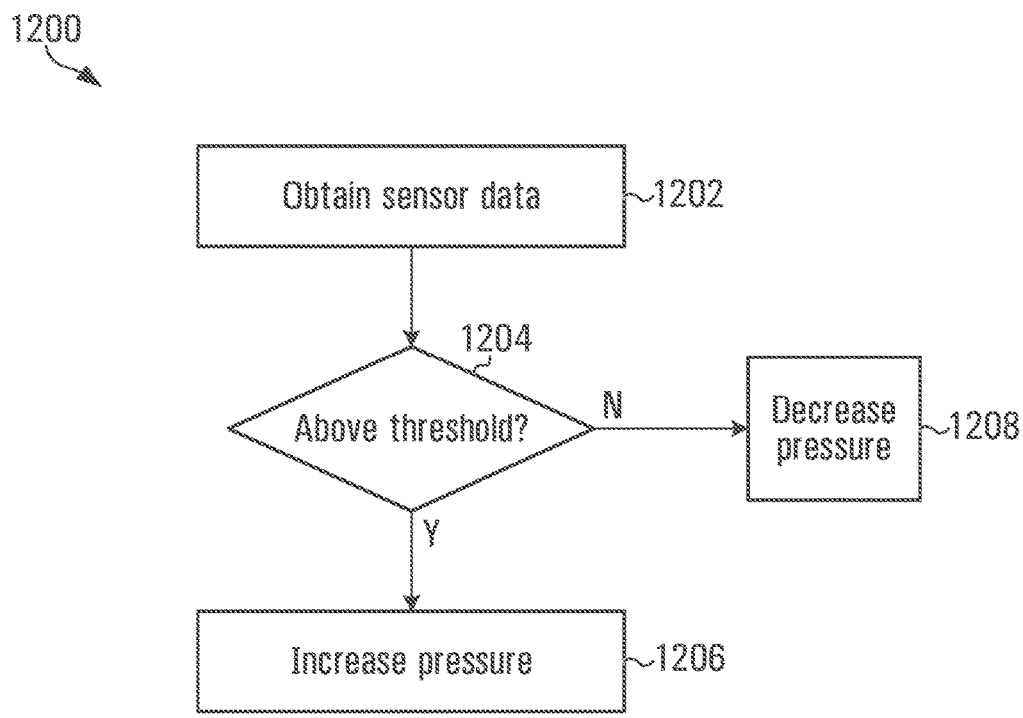
FIG. 12 shows a flowchart for adjusting pressure of a cooling system in accordance with an embodiment of the invention.

FIG. 12 shows a flowchart 1200 for adjusting pressure of the cooling system 100A in accordance with an embodiment of the invention. At step 1202, the sensor data from the sensor 110 is processed by the controller 106 and at step 1204 it is compared to a threshold value to see if the pressure of the coolant 108 in the vessel 104 should be increased (step 1206) or decreased (step 1208). For example, the sensor data may include information pertaining to the state of the coolant 108 adjacent to the surface of the IC 102 and of the pressure of the coolant 108 in vessel 104. The measured state of the coolant 108 along with the current pressure may then be processed by the controller to determine the desirable pressure of the coolant 108 in the vessel 104.

Figure 13:
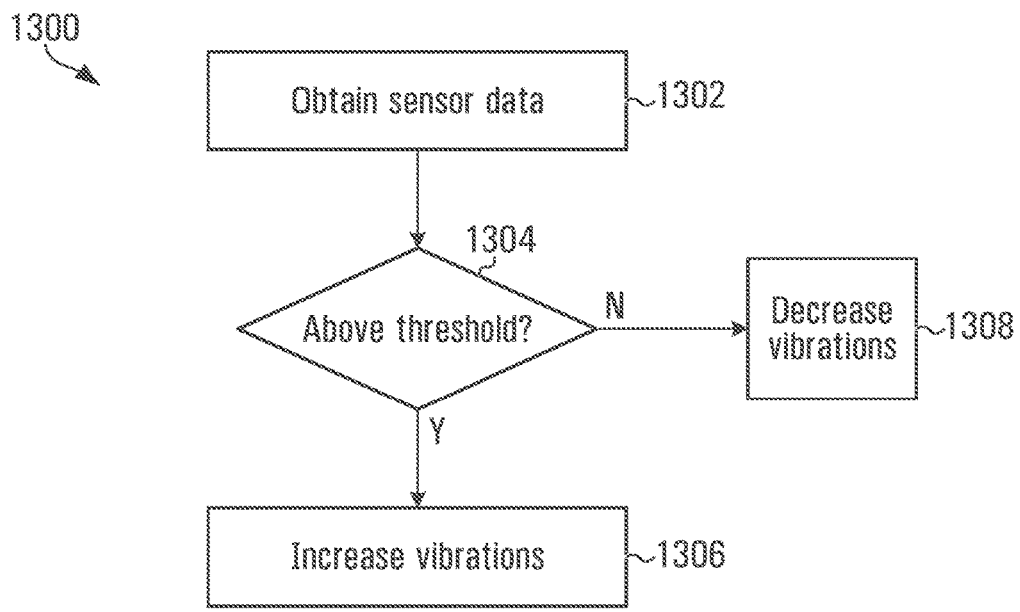
FIG. 13 shows a flowchart for adjusting vibrations of a cooling system in accordance with an embodiment of the invention.

FIG. 13 shows a flowchart 1300 for adjusting vibrations of the cooling system 100A in accordance with an embodiment of the invention. At step 1302, the sensor data from the sensor 110 is processed by the controller 106 and at step 1304 it is compared to a threshold value to see if the amount of vibrations of the IC surface should be increased (step 1206) or decreased (step 1208). For example, the sensor data may include information pertaining to the state of the coolant 108 adjacent to the surface of the IC 102. In such case, the current amount of vibrations being induced by the mechanism for inducting vibration on the IC 102 may be controlled by the controller 106. The measured state of the coolant 108 along with the known current amount of vibrations may then be processed by the controller 106 to determine the desirable amount of vibrations on the IC 102 to facilitate bubble release.

Figure 14:
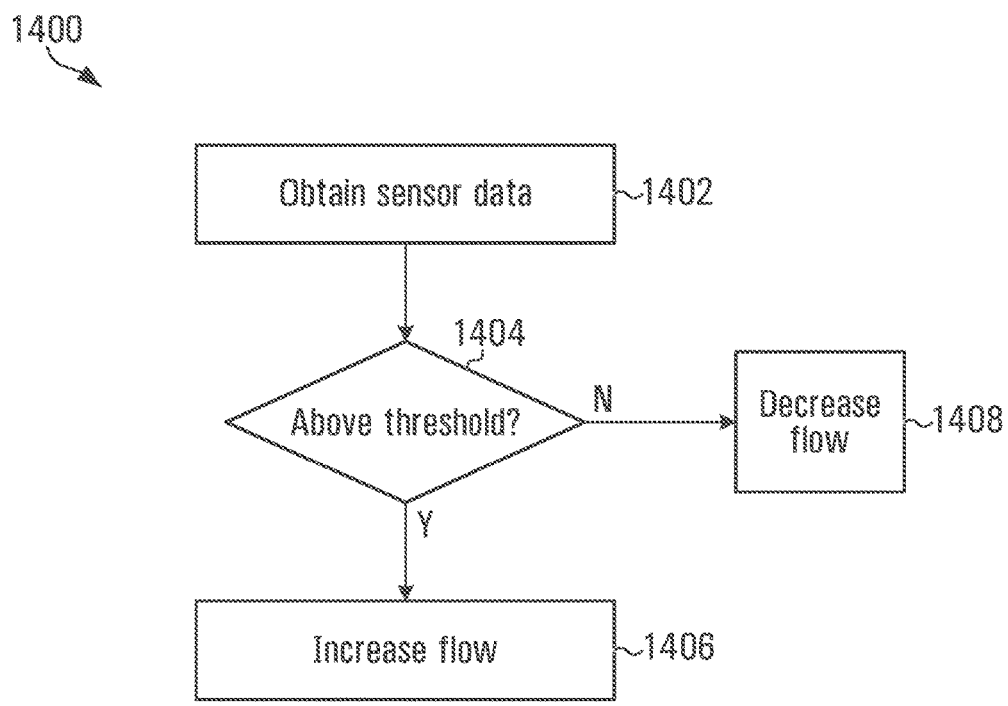
FIG. 14 shows a flowchart for adjusting flow of a coolant of a cooling system in accordance with an embodiment of the invention.

FIG. 14 shows a flowchart 1400 for adjusting flow of a coolant of a cooling system in accordance with an embodiment of the invention. At step 1402, the sensor data from the sensor 110 is processed by the controller 106 and at step 1404 it is compared to a threshold value to see if the flow of the coolant 108 in the vessel 104 should be increased (step 1406) or decreased (step 1408). For example, the sensor data may include information pertaining to the state of the coolant 108 adjacent to the surface of the IC 102. In such case, the current amount of coolant flow being induced by the mechanism for inducting coolant flow within the vessel 104 may be controlled by the controller 106. The measured state of the coolant 108 along with the known current amount coolant flow may then be processed by the controller 106 to determine the desirable amount of coolant flow within the vessel 104.

Although reference is made throughout this documents that the IC 102 is immersed in the coolant 108 of the vessel 104, it is appreciated that the electronic device 302 including the IC 102 may be immersed in the coolant 108 of the vessel 104 in other embodiments.

Certain additional elements that may be needed for operation of some embodiments have not been described or illustrated as they are assumed to be within the purview of those of ordinary skill in the art. Moreover, certain embodiments may be free of, may lack and/or may function without any element that is not specifically disclosed herein.

Any feature of any embodiment discussed herein may be combined with any feature of any other embodiment discussed herein in some examples of implementation.

The user of headings in the document is for illustrative purposes only and is not intended to be limiting.

Although various embodiments and examples have been presented, this was for the purpose of describing, but not limiting, the invention. Various modifications and enhancements will become apparent to those of ordinary skill in the art and are within the scope of the invention, which is defined by the appended claims.

The invention claimed is:

1. A system for cooling an Integrated Circuit (IC) having at least one surface, the system comprising:
   a. a vessel for holding a coolant in a liquid phase, the at least one surface being thermally coupled to the coolant to transfer heat generated by the IC to the coolant;
   b. the coolant and the IC being characterized by a steady-state Critical Heat Flux (CHF) value;
   c. a controller configured for:
      i. determine a window of time during which a heat flux from the IC to the coolant can be increased beyond the CHF value;
      ii. adjust at least one operational parameter of the IC to increase the heat flux from the IC to the coolant beyond for CHF value during the window of time;
      iii. after the expiration of the window of time adjust at least one operational parameter of the IC to decrease the heat flux from the IC to the coolant below the CHF value.

2. The system of claim 1, wherein the controller comprises software executed by a processor.

3. The system of claim 2, wherein the IC comprises the processor.

4. The system of claim 2, wherein the processor is external to the IC.

5. The system of claim 1, wherein the operational parameter of the IC to increase the heat flux beyond the CHF value is the clock frequency of the IC.

6. The system of claim 1 further comprising at least one sensor to sense a state of phase change of the coolant and which generates a signal, the signal being used by the controller to regulate the transfer of thermal energy between the IC and the coolant.

7. The system of claim 6, wherein the sensor comprises an optical sensor.

8. The system of claim 6, wherein the sensor comprises an acoustic sensor.

9. The system of claim 6, wherein the sensor comprises a temperature sensor.

10. The system of claim 6, wherein the sensor comprises a pressure sensor.

11. A method for cooling an Integrated Circuit (IC) in thermal contact through an interface with a coolant in a liquid phase, the method comprising:
    a. operating the IC in a transient heat flow mode to produce bubbles in the coolant which detach from the interface, including periodically varying at least one operational parameter of the IC that controls a rate of heat energy produced by the IC to perform a series of consecutive cycles, each cycle including a first part during which a heat flux from the IC to coolant is increased to a level above the steady-state Critical Heat Flux (CHF) value, and a second part during which a heat flux from the IC to coolant is reduced from the level above the CHF value to a level below the CHF value;
    b. controlling a time period during which the heat flux from the IC to coolant remains above the CHF value to substantially prevent bubbles from forming a dry film condition at the interface.

12. The method of claim 11 wherein the at least one operational parameter of the IC includes a clock frequency of the IC.

13. The method of claim 11 further includes sensing a state of phase change of the coolant via a sensor, the state of phase change being used by the controller at least in part for controlling the time period.

* * * * *